United States Patent
Kataoka et al.

(10) Patent No.: US 10,566,655 B2
(45) Date of Patent: Feb. 18, 2020

(54) SOLID ELECTROLYTE MATERIAL AND ALL SOLID LITHIUM ION SECONDARY BATTERY

(71) Applicant: National Institute of Advanced Industrial Science and Technology, Tokyo (JP)

(72) Inventors: Kunimitsu Kataoka, Ibaraki (JP); Chika Takamori, Ibaraki (JP); Haruo Ishizaki, Ibaraki (JP); Junji Akimoto, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 81 days.

(21) Appl. No.: 15/776,229

(22) PCT Filed: Dec. 26, 2016

(86) PCT No.: PCT/JP2016/088767
§ 371 (c)(1),
(2) Date: May 15, 2018

(87) PCT Pub. No.: WO2017/130622
PCT Pub. Date: Aug. 3, 2017

(65) Prior Publication Data
US 2019/0341651 A1    Nov. 7, 2019

(30) Foreign Application Priority Data

Jan. 29, 2016 (JP) ................... 2016-016060
Jan. 29, 2016 (JP) ................... 2016-016061

(51) Int. Cl.
*H01M 10/0525* (2010.01)
*H01M 10/0562* (2010.01)
(Continued)

(52) U.S. Cl.
CPC ...... *H01M 10/0562* (2013.01); *C01G 33/006* (2013.01); *C01G 35/006* (2013.01);
(Continued)

(58) Field of Classification Search
CPC .. C01G 25/006; C01G 33/006; C01G 35/006; H01M 10/0525; H01M 10/0562; H01M 2300/0071
See application file for complete search history.

(56) References Cited

U.S. PATENT DOCUMENTS 3,446,603 A    5/1969   Loiacono et al.
2004/0035357 A1*  2/2004   Sekijima ................. C30B 13/00
                                                        117/84
(Continued)

FOREIGN PATENT DOCUMENTS

CN    102308425 A    1/2012
CN    103687811 A    3/2014
(Continued)

OTHER PUBLICATIONS

English translation of JP Publication 2010-272344, Dec. 2010.*
(Continued)

*Primary Examiner* — Brittany L Raymond
(74) *Attorney, Agent, or Firm* — Studebaker & Brackett PC

(57) ABSTRACT

There are provided a solid electrolyte material having high density and ion conductivity, and an all solid lithium ion secondary battery using the solid electrolyte material. The solid electrolyte material has a garnet-related structure which has a chemical composition represented by $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) and relative density of 99% or greater, and belongs to a cubic system. The solid electrolyte material has lithium ion conductivity which is equal to or greater than $1.0 \times 10^{-3}$ (Continued)

S/cm. The solid electrolyte material has a lattice constant a which satisfies 1.28 nm≤a≤1.30 nm, and has a lithium ion which occupies only two or more 96h sites in a crystal structure. The all solid lithium ion secondary battery includes a positive electrode, a negative electrode, and a solid electrolyte. The solid electrolyte includes the solid electrolyte material.

12 Claims, 11 Drawing Sheets

(51) Int. Cl.
    *C01G 35/00*    (2006.01)
    *C01G 33/00*    (2006.01)

(52) U.S. Cl.
    CPC ..... *H01M 10/0525* (2013.01); *C01P 2002/30* (2013.01); *C01P 2002/72* (2013.01); *C01P 2002/74* (2013.01); *C01P 2002/77* (2013.01); *C01P 2004/02* (2013.01); *C01P 2006/40* (2013.01)

(56) References Cited

U.S. PATENT DOCUMENTS

| | | |
|---|---|---|
| 2011/0244337 A1 | 10/2011 | Ohta et al. |
| 2012/0298031 A1* | 11/2012 | Ito .................... C30B 13/24 117/50 |
| 2014/0295287 A1 | 10/2014 | Eisele et al. |
| 2015/0024292 A1* | 1/2015 | Yamada ............... H01M 12/08 429/405 |
| 2016/0293988 A1* | 10/2016 | Sakamoto ........... H01M 8/1253 |

FOREIGN PATENT DOCUMENTS

| | | |
|---|---|---|
| JP | 2010-272344 | * 12/2010 |
| JP | 2010-272344 A | 12/2010 |
| JP | 2011-144081 A | 7/2011 |
| JP | 2011-195372 A | 10/2011 |
| JP | 2011-195373 A | 10/2011 |
| JP | 2016-072210 A | 5/2016 |
| KR | 10-2015-0129953 A | 11/2015 |

OTHER PUBLICATIONS

International Preliminary Report on Patentability and Written Opinion issued in PCT/JP2016/088767; dated Jul. 31, 2018.
International Search Report issued in PCT/JP2016/088767; dated Feb. 7, 2017.
Junji Awaka et al.; "Synthesis and Structure Analysis of Tetragonal Li7La3Zr2O12 with the Garnet-Related Type Structure"; Journal of Solid State Chemistry; 2009; pp. 2046-2052; vol. 182.
Xia Tong et al.; "Highly Conductive Li Garnets by a Multielement Doping Strategy"; Inorganic Chemistry; Mar. 20, 2015; pp. 3600-3607; vol. 54.
Huang et al.: "Preparation and electrochemical properties of Zr-site substituted Li7La3 (Zr2-xMx)O12 (M=Ta, Nb) solid electrolyte"; Journal of Power Sources; Elsevier; Mar. 26, 2014; pp. 206-211; vol. 261; XP028652902.
Zhang et al.: "Field assisted sintering of dense Al-substituted cubic phase Li7La3Zr2O12 solid electrolytes"; Journal of Power Sources; Elsevier; Apr. 24, 2014; pp. 960-964; vol. 268; XP029010517.
Tong et al.: "Highly Conductive Li Garnets by a Multielement Doping Strategy"; Inorganic Chemistry; Apr. 6, 2015; pp. 3600-3607; vol. 54; XP055347903.

* cited by examiner

SOLID ELECTROLYTE MATERIAL AND ALL SOLID LITHIUM ION SECONDARY BATTERY

TECHNICAL FIELD

The present invention relates to a solid electrolyte material having high density and ion conductivity, and an all solid lithium ion secondary battery using the solid electrolyte material.

BACKGROUND ART

A lithium ion secondary battery has high energy density and is capable of being operated at a high potential, in comparison to secondary batteries such as a Ni—Cd battery and a Ni-MH battery. Therefore, the lithium ion secondary battery is widely used in small information equipment such as a mobile phone or a laptop. Since reducing the size and the weight of the lithium ion secondary battery is easily achieved, a demand as a secondary battery for hybrid vehicles and electric vehicles is increased. When being used for vehicles and the like, high safety is required. Thus, an all solid lithium ion secondary battery which does not use a flammable electrolyte is researched and developed. High ion conductivity is required for a solid electrolyte used in the all solid lithium ion secondary battery.

It is reported that a material having a cubic garnet-related structure has high ion conductivity (Patent Document 1). Thus, research and development of a material having such a structure are in progress. In particular, it is reported that a material of a chemical composition $Li_{7-x}La_3Zr_{2-x}Nb_xO_{12}$ has high lithium ion conductivity in the vicinity of x=0.25, and a material of a chemical composition $Li_{7-x}La_3Zr_{2-x}Ta_xO_{12}$ has high lithium ion conductivity in the vicinity of x=0.5.

In order to realize high lithium ion conductivity, it is necessary that grain boundary resistance or interfacial resistance is significantly reduced. Therefore, it is desirable that the solid electrolyte includes a solid material which is a high-density molded article. The solid material which is the high-density molded article is capable of preventing an occurrence of a short-circuit between a positive electrode and a negative electrode during charging and discharging, and the solid material can be thinned. Thus, reduction in size of the all solid lithium ion secondary battery may be allowed. However, it is known that the material having a cubic garnet-related structure has difficulty in being sintered, and it is difficult to produce a high-density molded article by using the material.

CITATION LIST

Patent Document

Patent Document 1: Japanese Patent Application Laid-Open No. 2011-195373

Non-Patent Document

Non-Patent Document 1: J. Awaka, N. Kijima, H. Hayakawa, J. Akimoto, Journal of Solid State Chemistry, 182, P 2046-2052 (2009)

SUMMARY

Technical Problem

Considering such circumferences, an object of the present invention is to provide a lithium solid electrolyte material having high density and a producing method thereof, and an all solid lithium ion secondary battery in which such a lithium solid electrolyte material is used as a solid electrolyte.

Solution to Problem

The present inventors considered that a method of producing a crystal body was devised, and thereby $Li_{7-x-y}La_3Zr_{2-x-y}Ta_xNb_yO_{12}$ crystal of high density, in which a grain boundary does not exist was obtained. However, if a raw material is heated at a high temperature at which a garnet-related structure including a lithium-containing garnet crystal body is melted, lithium volatilizes, and thus lithium deficiency occurs and the raw material is broken down into lanthanum zirconium oxide. That is, if a raw material having the same composition as the aimed lithium-containing garnet single crystal is grown at a general growth rate of about 4 mm/h, a period when the growing portion is being melted at a high temperature is long. Thus, lithium volatilizes, and thus a single crystal of lanthanum zirconium oxide is obtained instead of a lithium-containing garnet single crystal. If a system containing a volatile component is grown by a melting method, a gas generated by volatilization stays at the melted portion, and thus growth is unstable.

Because of the above-described problems, growth of a single crystal having a garnet-related structure by an FZ method or a CZ method has not been performed until now. The phase of the garnet-related structure when the temperature is increased until the raw material is melted has not been reported. The present inventors closely researched a producing method of $Li_{7-x-y}La_3Zr_{2-x-y}Ta_xNb_yO_{12}$ crystal, in which a sample obtained by mixing raw materials was melted at a high temperature and then was cooled.

As a result, it was understood that formation of lanthanum zirconium oxide by volatilization of lithium was capable of being suppressed by combining the proper amount of lithium and the proper growth rate. Further, it was found that, if the volatilized gas did not stay at the melted portion, but was released rapidly from the melted portion by rotating the sample obtained by mixing the raw materials at a high speed, growth of a single crystal was capable of being stabilized. It was confirmed that $Li_{7-x-y}La_3Zr_{2-x-y}Ta_xNb_yO_{12}$ crystal having a garnet-related structure of high density was capable of growing and the $Li_{7-x-y}La_3Zr_{2-x-y}Ta_xNb_yO_{12}$ crystal was allowed to be mechanically thinned, and the present invention was completed.

According to the present invention, a solid electrolyte material has a chemical composition represented by $Li_{7-x-y}La_3Zr_{2-x-y}Ta_xNb_yO_{12}$ (0≤x≤0.8, 0.2≤y≤1, and 0.2≤x+y≤1), relative density of 99% or greater, and a garnet-related structure, and belongs to a cubic system. x may be 0, that is, Ta may not be included.

The present inventors found that a high-density rod of high density crystal of $Li_{7-x-y}La_3Zr_{2-x-y}Ta_xNb_yO_{12}$ (0≤x≤0.8, 0.2≤y≤1, and 0.2≤x+y≤1) was capable of being produced in a manner that polycrystal $Li_{(7-x-y)z}La_3Zr_{2-x-y}Ta_xNb_yO_{12}$ (0≤x≤0.8, 0.2≤y≤1, 0.2≤x+y≤1, and 1<z≤2) was molded to have a rod shape, and then the polycrystal was melted and quickly cooled by an FZ method using infrared condensing heating. Since the high-density rod has high strength, unintended breakage and the like occur less frequently, and it is possible to be easily cut out by a diamond cutter and the like. It was also found that a thin piece of $Li_{7-x-y}La_3Zr_{2-x-y}Ta_xNb_yO_{12}$ crystal, which has a thickness of about 0.1 mm was capable of being produced by cutting out the high-density rod.

According to the present invention, a producing method of a solid electrolyte material in which a solid electrolyte material which has a chemical composition represented by $Li_{7-x-y}La_3Zr_{2-x-y}Ta_xNb_yO_{12}$ ($0 \le x \le 0.8$, $0.2 \le y \le 1$, and $0.2 \le x+y \le 1$), relative density of 99% or greater, and a garnet-related structure, and belongs to a cubic system is produced in a manner that a melted portion at which a single crystal is grown is formed by melting at least a portion of a raw material having a chemical composition represented by $Li_{(7-x-y)z}La_3Zr_{2-x-y}Ta_xNb_yO_{12}$ ($0 \le x \le 0.8$, $0.2 \le y \le 1$, $0.2 \le x+y \le 1$, and $1 < z \le 2$), the melted portion is moved at a movement rate of 8 mm/h or faster, and a single crystal is grown.

According to the present invention, an all solid lithium ion secondary battery includes a positive electrode, a negative electrode, and a solid electrolyte. The solid electrolyte includes the solid electrolyte material according to the present invention.

Advantageous Effects of Invention

According to the present invention, the solid electrolyte material has a new garnet-related structure in which a position occupied by a lithium ion is different from that in a garnet-related structure in the related art, and the solid electrolyte material has high density and ion conductivity. If the solid electrolyte material according to the present invention is used as a solid electrolyte, an all solid lithium ion secondary battery has high performance.

DESCRIPTION OF EMBODIMENTS

Figure 1:
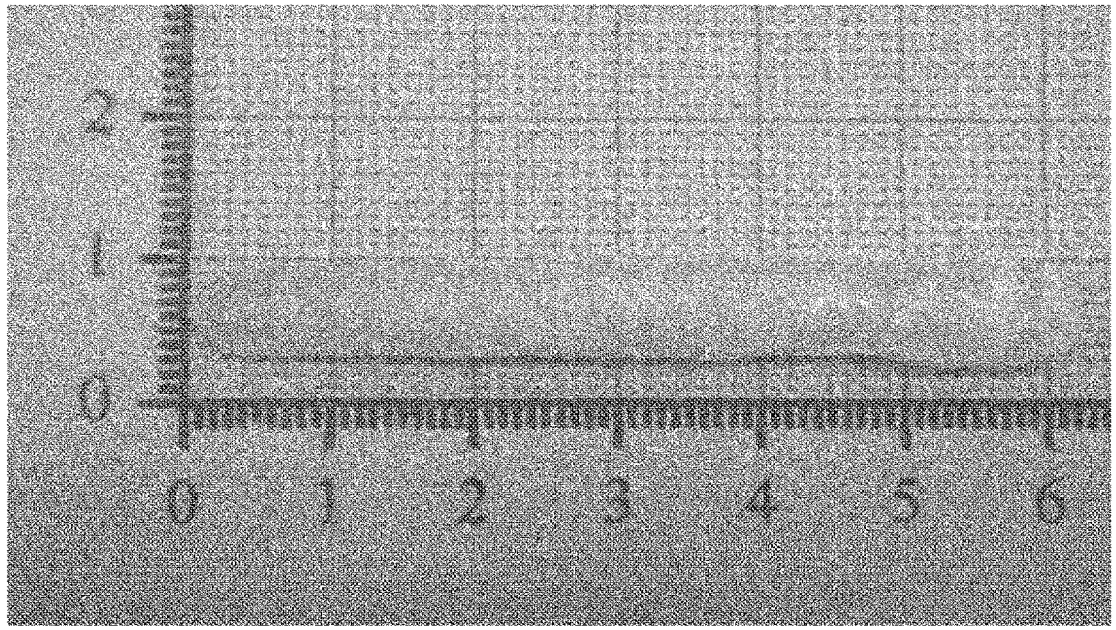
FIG. 1 is an exterior photograph of $Li_{6.5}La_3Zr_{1.5}Ta_{0.25}Nb_{0.25}O_{12}$ single crystal obtained in Example 1.

Hereinafter, a solid electrolyte material, a producing method of the solid electrolyte material, and an all solid lithium ion secondary battery according to the present invention will be described in detail, based on an embodiment and examples. Repetitive descriptions will be appropriately omitted.

A solid electrolyte material according to an embodiment of the present invention is a lithium-containing garnet crystal body. The lithium-containing garnet crystal body has a chemical composition represented by $Li_{7-x-y}La_3Zr_{2-x-y}Ta_xNb_yO_{12}$ ($0 \le x \le 0.8$, $0.2 \le y \le 1$, and $0.2 \le x+y \le 1$), belongs to a cubic system, and has a garnet-related structure. The garnet-related structure is a crystal structure in which a B site having O and tetrahedral coordination is not occupied and comes into a void, and alternatively, Li occupies a void in the crystal structure, among garnet structures which have a crystal system which is cubic, symmetry of the crystal structure which belongs to a space group Ia-3d, and is represented by a formula $C_3A_2B_3O_{12}$ represented by YAG and the like.

Among lithium-containing garnet crystal bodies in the embodiment, a crystal body $Li_{7-y}La_3Zr_{2-y}Nb_yO_{12}$ ($y \ne 0$) which does not include Ta has a crystal structure in which La occupies an A site, Zr and Nb occupy C sites, and Li occupies a void. Among the lithium-containing garnet crystal bodies in the embodiment, a crystal body $Li_{7-x-y}La_3Zr_{2-x-y}Ta_xNb_yO_{12}$ ($xy \ne 0$) including Ta has a crystal structure in which La occupies an A site, Zr, Ta, and Nb occupy C sites, and Li occupies a void.

The position of Li occupying a void in the lithium-containing garnet crystal body in the embodiment is different from that in the garnet-related structure which has been reported until now. That is, in the garnet-related structure which has been conventionally reported, two kinds of lithium ions are provided. If occupying sites of the lithium ions are indicated by Wyckoff positions, one kind of 24d site and one kind of 96h site are provided. On the contrary, in the garnet-related structure of the lithium-containing garnet crystal body in the embodiment, two kinds of 96h sites are provided. Thus, the lithium-containing garnet crystal body in the embodiment has a new crystal structure which is different from the garnet-related structure in the related art.

In the notation for describing a set of equivalent positions in a crystal structure, the Wyckoff position is configured by the number of equivalent points in the crystal structure, which is referred to as multiplicity, and a Wyckoff letter which is alphabetically assigned from the position having the highest symmetry. The crystal structure of the lithium-containing garnet crystal body in the embodiment can be represented by a space group Ia-3d. In practice, if single crystal X-ray diffraction measurement is performed on the lithium-containing garnet crystal body in the embodiment, a very weak diffraction spot is observed at a forbidden reflection position of the space group Ia-3d, as illustrated in FIGS. 3, 4, 10, and 11 which will be described later.

Figure 2:
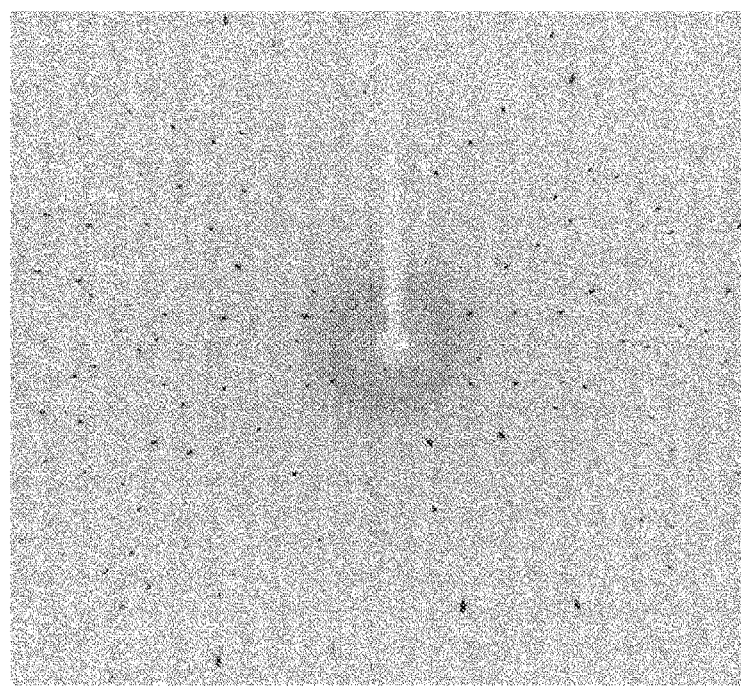
FIG. 2 illustrates a single crystal X-ray diffraction pattern of the $Li_{6.5}La_3Zr_{1.5}Ta_{0.25}Nb_{0.25}O_{12}$ single crystal obtained in Example 1.
Figure 3:
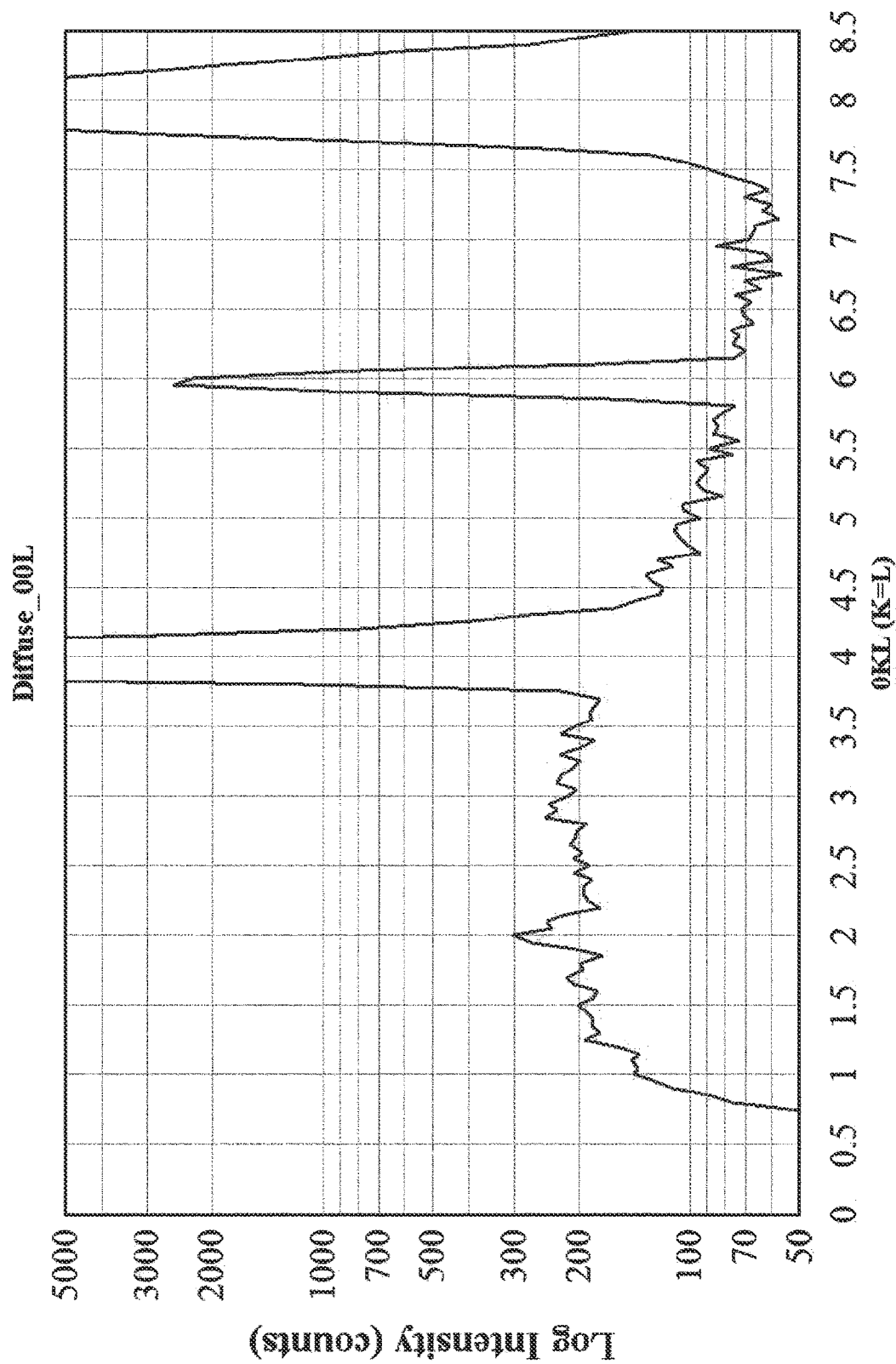
FIG. 3 illustrates 00L scan by a single crystal X-ray diffraction apparatus of the $Li_{6.5}La_3Zr_{1.5}Ta_{0.25}Nb_{0.25}O_{12}$ single crystal obtained in Example 1.
Figure 4:
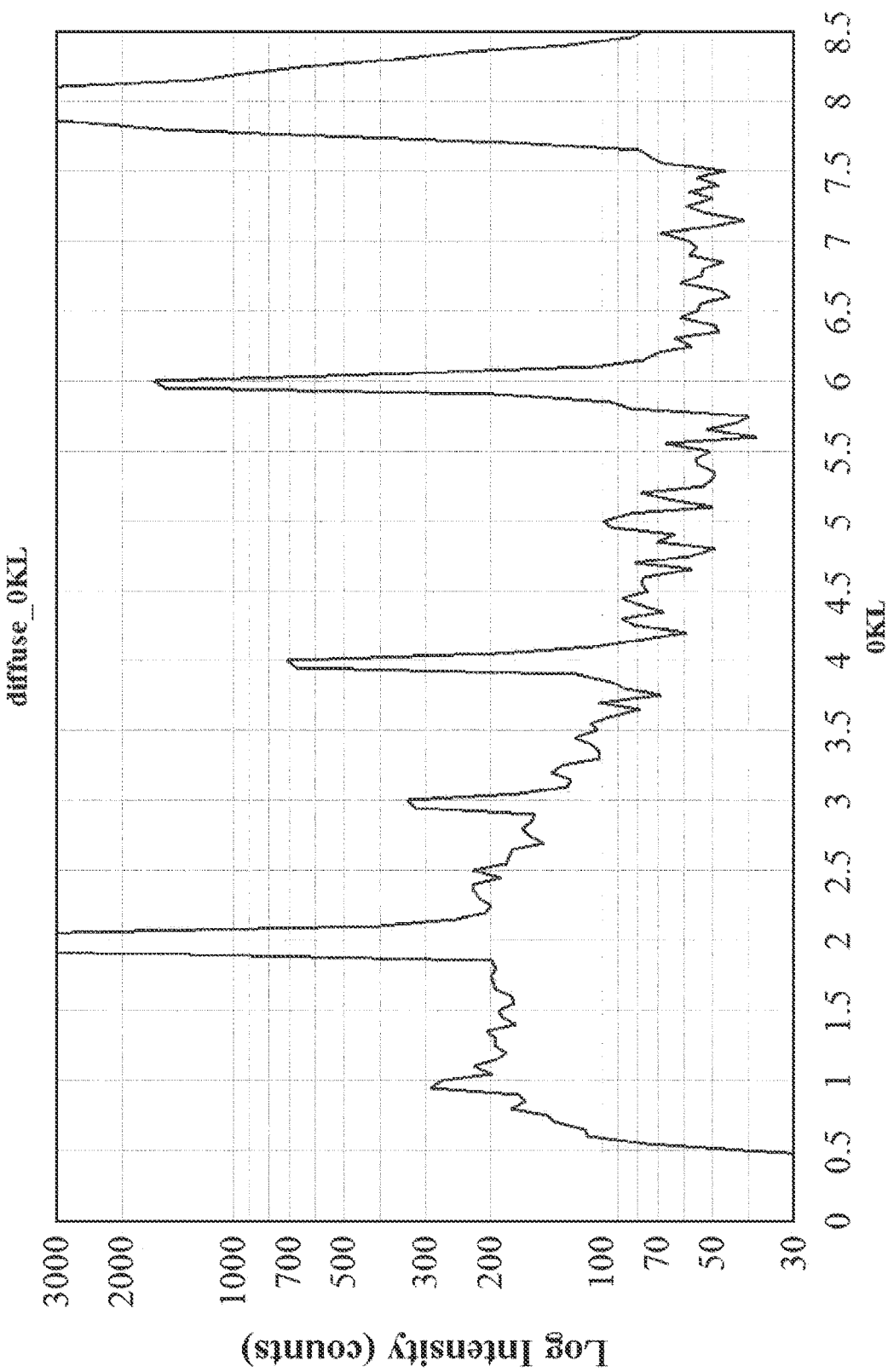
FIG. 4 illustrates 0KL (K=L) scan by the single crystal X-ray diffraction apparatus of the $Li_{6.5}La_3Zr_{1.5}Ta_{0.25}Nb_{0.25}O_{12}$ single crystal obtained in Example 1.
Figure 10:
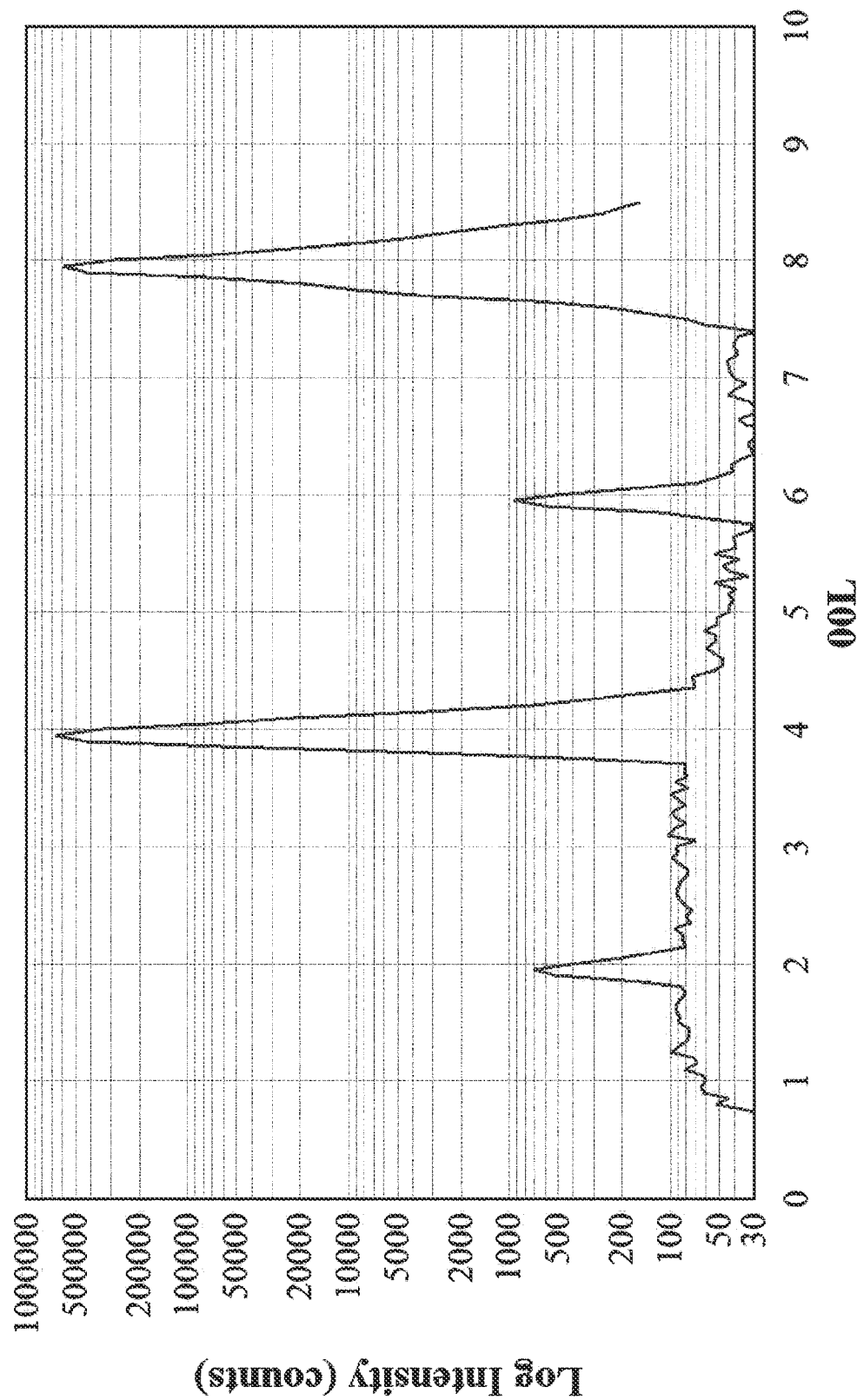
FIG. 10 illustrates 00L scan by a single crystal X-ray diffraction apparatus of the $Li_{6.55}La_3Zr_{1.55}Nb_{0.45}O_{12}$ single crystal obtained in Example 2.
Figure 11:
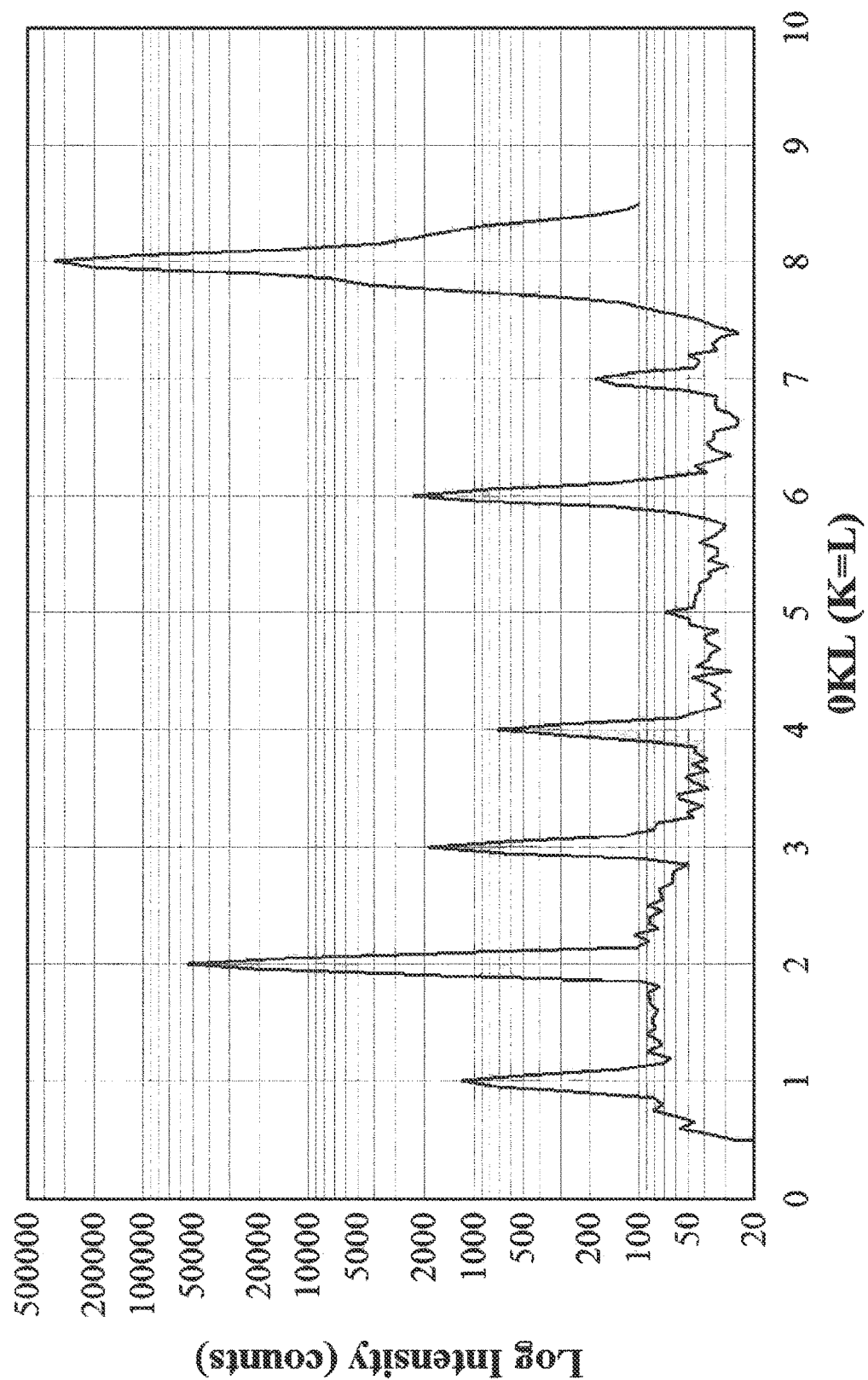
FIG. 11 illustrates 0KL (K=L) scan by the single crystal X-ray diffraction apparatus of the $Li_{6.55}La_3Zr_{1.55}Nb_{0.45}O_{12}$ single crystal obtained in Example 2.

In FIGS. 3 and 10, 002 reflection and 006 reflection correspond to forbidden reflection. In FIGS. 4 and 11, 011 reflection, 033 reflection, 055 reflection, and 077 reflection correspond to forbidden reflection. The consequences imply that the crystal structure of the lithium-containing garnet crystal body in the embodiment has a space group having lower symmetry. However, since intensity which can be detected in the single crystal X-ray diffraction measurement is very small, it is difficult to apply such consequences to crystal structure analysis.

The forbidden reflection means Bragg reflection satisfying the Bragg condition which causes reflection intensity to be 0 such that a crystal structure factor is 0, in diffraction phenomena of an X-ray and a particle beam. The forbidden reflection can be determined by symmetry, that is, the space group of the crystal structure. The crystal structure factor provides the amplitude and the phase of a diffracted wave from crystal. Thus, the crystal structure factor is determined by the type and the position of an atom in the crystal structure.

In the lithium-containing garnet crystal body in the embodiment, as described above, the lithium ion site is different from that in the garnet-related structure in the related art, and a distance between lithium ions is reduced. As the distance between lithium ions becomes closer, a diffusion distance is also reduced, in the lithium-containing garnet crystal body. Thus, as a result, lithium ion conductivity is improved. Accordingly, the lithium-containing garnet crystal body in the embodiment is useful as a lithium-ion solid electrolyte material.

The lithium-containing garnet crystal body in the embodiment has relative density of 99% or greater. The relative density is calculated in a manner as follows. The outer shape of the produced thin piece is measured, and the apparent volume is calculated. The apparent density calculated from the measured mass is divided by true density obtained from an X-ray structure analysis result of the single crystal. In the lithium-containing garnet crystal body in the embodiment, higher relative density is more preferable, and a case where the relative density is 100% is particularly preferable. It is not necessary that all crystal domains are directed in the same direction, in the lithium-containing garnet crystal body in the embodiment. The lithium-containing garnet crystal body in the embodiment has high ion conductivity. Specifically, lithium ion conductivity is equal to or greater than $1.0 \times 10^{-3}$ S/cm. It is preferable that the lattice constant a of the lithium-containing garnet crystal body in the embodiment satisfies 1.28 nm≤a≤1.30 nm.

Regarding a lithium-containing garnet crystal body in which a proportion of crystal domains aligned in the same direction is high, the diffraction spot is observed as a clear point in X-ray diffraction measurement using single crystal. Regarding a sample of $Li_{7-x-y}La_3Zr_{2-x-y}Ta_xNb_yO_{12}$ crystal which has been produced in the experiment and is a cubic crystal, and in which orientations of crystal domains are not aligned, diffraction spots are complicated, or kinds of diffraction from various domains overlap each other so as to form a diffraction spot having a substantially ring shape, in X-ray diffraction measurement. Generally, in an FZ method, a crystal is produced while the melted portion of a raw material is moved at 110 mm/h. In this manner, a cooling rate of the melted portion is too fast. Thus, growing to cause orientations of crystal domains to be necessarily uniform in the sample is not possible.

Figure 6:
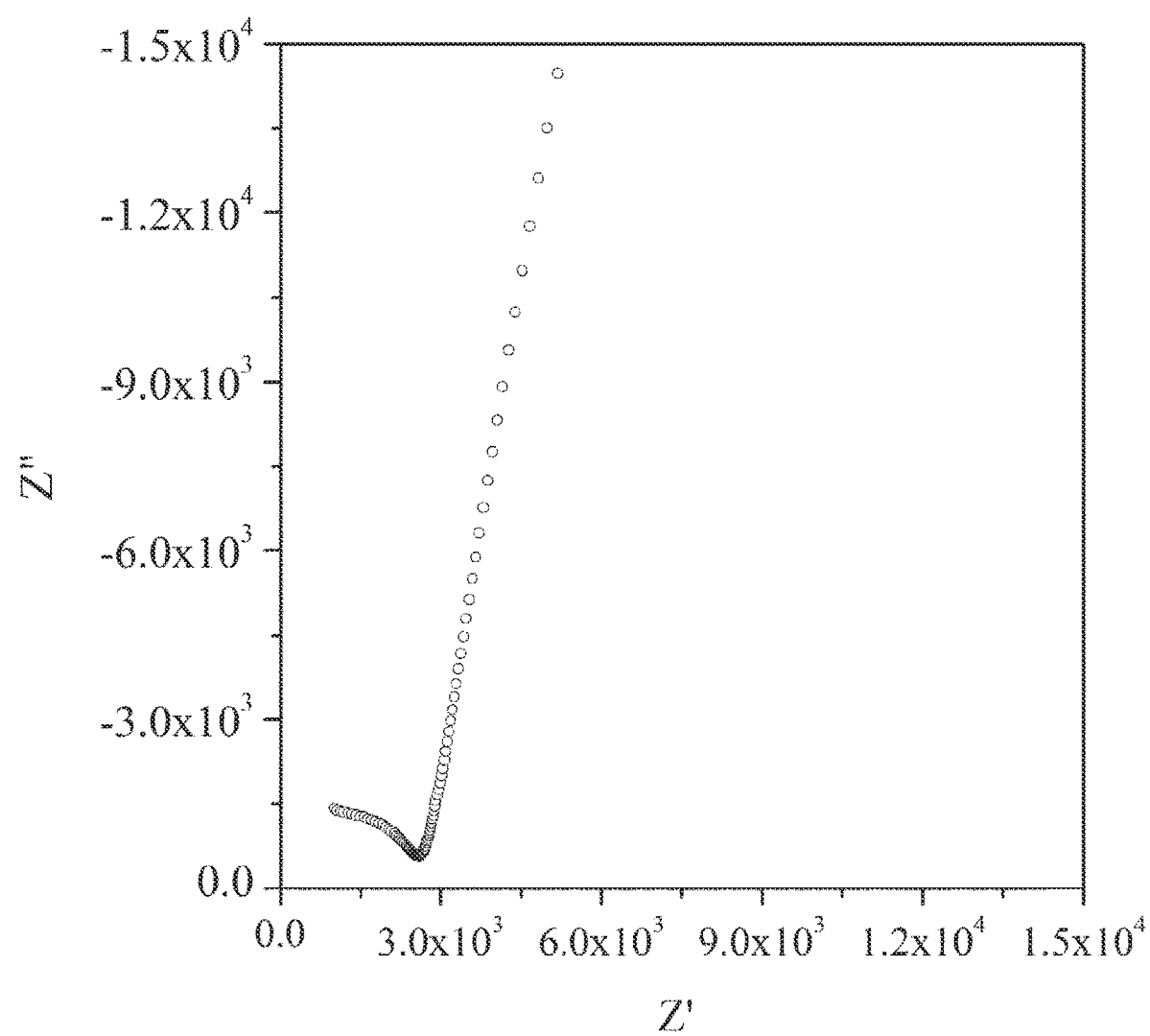
FIG. 6 illustrates a Nyquist plot of the $Li_{6.5}La_3Zr_{1.5}Ta_{0.25}Nb_{0.25}O_{12}$ single crystal obtained in Example 1.
Figure 13:
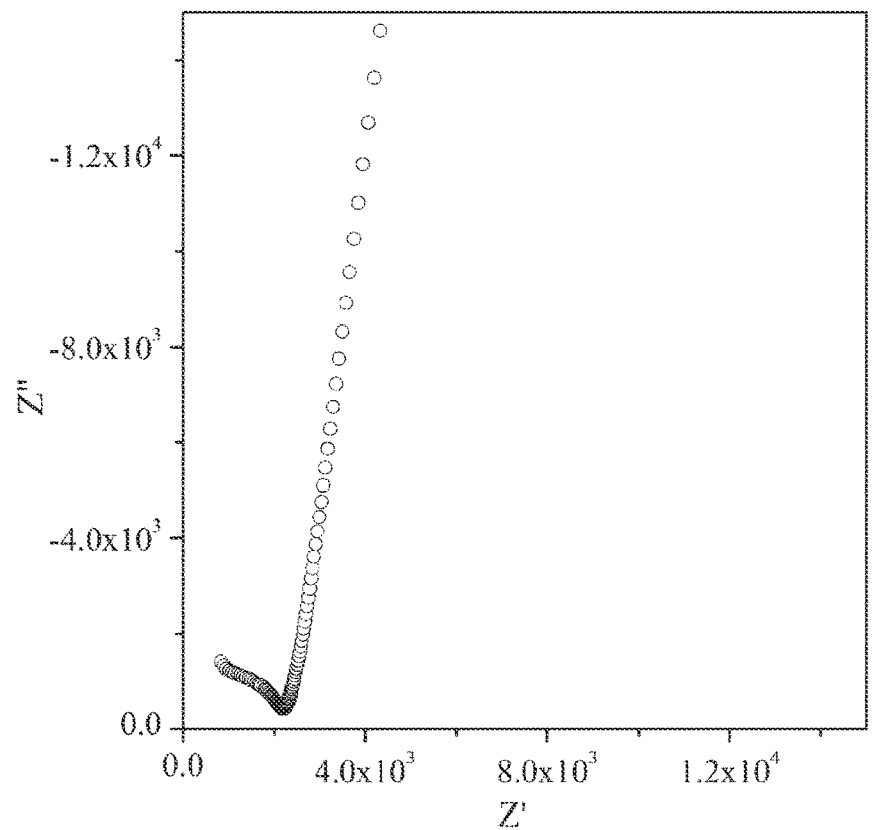
FIG. 13 illustrates a Nyquist plot of the $Li_{6.55}La_3Zr_{1.45}Nb_{0.45}O_{12}$ single crystal obtained in Example 2.

In a case of a polycrystal body, it is difficult to increase relative density. Therefore, in AC impedance measurement, many voids in the polycrystal body are reflected in the measurement result. For example, in the reported polycrystal body of $Li_7La_3Zr_2O_{12}$, the Nyquist plot by AC impedance measurement shows two resistance components of a resistance component by a crystal grain boundary and a resistance component of the material itself (see Non-Patent Document 1). On the contrary, the Nyquist plot of the lithium-containing garnet crystal body in the embodiment does not show the resistance component by a crystal grain boundary, and but shows only the resistance component of the material itself, as illustrated in FIGS. 6 and 13 (which will be described later). In the lithium-containing garnet crystal body in the embodiment, diffraction spots in a diffraction pattern may be shown to have a ring shape, in X-ray diffraction measurement, neutron diffraction measurement, or electron diffraction measurement which uses a single crystal.

The present inventors found that, if a raw material mixture including the more amount of lithium than the composition ratio of the aimed solid electrolyte material was melted at a high temperature and then was cooled, single crystal of $Li_{7-x-y}La_3Zr_{2-x-y}Ta_xNb_yO_{12}$ (0≤x≤0.8, 0.2≤y≤1, and 0.2≤x+y≤1), which belonged to the cubic system and had a garnet-related structure was obtained. In a case where the single crystal which belongs to the cubic system and has a garnet-related structure is grown by an FZ method, generally, a sample rod is rotated at 20 rpm or slower, and is lowered at a descent speed of about 2 mm/h. However, in this condition, voids are provided in $Li_{7-x-y}La_3Zr_{2-x-y}Ta_xNb_yO_{12}$ (0≤x≤0.8, 0.2≤y≤1, and 0.2≤x+y≤1), and thus it is not possible to produce a crystal having high density.

In order to produce a crystal in which a void is not provided, the melted portion of a rod-like raw material is lowered at a movement rate of 8 mm/h or faster and the melted portion is cooled at a high speed, while the raw material is rotated at a high speed. A rod of the obtained $Li_{7-x-y}La_3Zr_{2-x-y}Ta_xNb_yO_{12}$ (0≤x≤0.8, 0.2≤y≤1, and 0.2≤x+y≤1) crystal having high density can be cut out so as to have any thickness, by a diamond cutter or the like. The $Li_{7-x-y}La_3Zr_{2-x-y}Ta_xNb_yO_{12}$ (0≤x≤0.8, 0.2≤y≤1, and 0.2≤x+y≤1) crystal having high density in the embodiment is produced by melting a raw material mixture in which the amount of lithium is increased in comparison to the stoichiometric ratio of each metal in the chemical composition $Li_{7-x-y}La_3Zr_{2-x-y}Ta_xNb_yO_{12}$ (0≤x≤0.8, 0.2≤y≤1, and 0.2≤x+y≤1) considering that lithium volatilizes at a high temperature.

The solid electrolyte material in the present invention can be produced in a manner as follows. A melted portion for single crystal growth is formed by melting at least a portion of a raw material having a chemical composition represented by $Li_{(7-x-y)z}La_3Zr_{2-x-y}Ta_xNb_yO_{12}$ (0≤x≤0.8, 0.2≤y≤1, 0.2≤x+y≤1, and 1<z≤2). While the melted portion is moved at a movement rate of 8 mm/h or faster, the melted portion is rotated around the central axis parallel to a movement direction, at a high speed.

As described above, $Li_{7-x-y}La_3Zr_{2-x-y}Ta_xNb_yO_{12}$ (0≤x≤0.8, 0.2≤y≤1, and 0.2≤x+y≤1) crystal having high-density in the embodiment can also be grown by using a Czochralski (CZ) method, a Bridgman method, a pedestal method, and the like in addition to the FZ method, so long as the method is a producing method in which the melted portion for single crystal growth can be moved at a speed of 8 mm/h or faster and the melted portion can be rotated around the central axis parallel to a movement direction, at a high speed. The proper producing method may be selected from the above-described methods, in accordance with the size, the shape, or the like of $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal desired to be produced.

The $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal having relative density of 100%, that is, the original single crystal of $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) can be produced by the FZ method. The $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal having relative density of 100% has lithium ion conductivity which is particularly excellent. Rotation at a rotation speed of 30 rpm or higher is preferable as high-speed rotation.

In a case where the solid electrolyte material in the embodiment is produced by the FZ method, a crystal is grown in a manner that a rod-like raw material is melted while being rotated at a high speed in a plane perpendicular to a longitudinal direction of the rod-like raw material, and the melted portion of the raw material is moved in the longitudinal direction. Since the movement rate of the melted portion is set to be fast, that is, equal to or faster than 8 mm/h, decomposition of the raw material by volatilization of lithium is suppressed. The movement rate of the melted portion is preferably 8 mm/h to 19 mm/h. Bubbles rise at the melted portion by volatilization of lithium. However, since the rotation speed of the rod-like raw material is set to be fast, that is, equal to or higher than 30 rpm, it is possible to remove the bubbles. The rotation speed of the raw material is preferably 30 rpm to 60 rpm. It is preferable that melting of the raw material and moving of the melted portion are performed in an atmosphere of dry air.

In this manner, it is possible to produce $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal having relative density of 99% or greater. The producing method of the solid electrolyte material in the embodiment will be described by using growth of $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal which has relative density of 99% or greater, belongs to the cubic system, and has a garnet-related structure, as an example.

Firstly, a rod-like raw material is produced in a manner as follows. Firstly, a lithium compound, a lanthanum compound, a zirconium compound, a tantalum compound, and a niobium compound are weighed so as to cause the substance quantity ratio (so-called molar ratio) Li:La:Zr:Ta:Nb to obtain (7-x-y)z:3:2-x-y:x:y ($0 \leq x \leq 0.8$, $0.2 \leq y \leq 1$, $0.2 \leq x+y \leq 1$, $1 < z \leq 2$) considering that lithium volatilizes at a high temperature.

The lithium compound is not particularly limited so long as the compound contains lithium, and oxides such as $Li_2O$ and carbonates such as $Li_2CO_3$ are exemplified. The lanthanum compound is not particularly limited so long as the compound contains lanthanum, and oxides such as $La_2O_3$ and hydroxides such as $La(OH)_3$ are exemplified. The zirconium compound is not particularly limited so long as the compound contains zirconium, and oxides such as $ZrO_2$ and chlorides such as $ZrCl_4$ are exemplified. The tantalum compound is not particularly limited so long as the compound contains tantalum, and oxides such as $Ta_2O_5$ and chlorides such as $TaCl_5$ are exemplified. The niobium compound is not particularly limited so long as the compound contains niobium, and oxides such as $Nb_2O_5$ and chlorides such as $NbCl_5$ are exemplified.

Weighing may be performed by using a compound formed of two kinds or more selected from lithium, lanthanum, zirconium, tantalum, and niobium, such that the molar ratio of Li:La:Zr:Ta:Nb is (7-x-y)z:3:2-x-y:x:y ($0 \leq x \leq 0.8$, $0.2 \leq y \leq 1$, $0.2 \leq x+y \leq 1$, and $1 < z \leq 2$). As such a compound formed of two kinds or more, lithium zirconium oxide such as $Li_2ZrO_3$, lithium tantalum oxide such as $LiTaO_3$, lithium niobium oxide such as $LiNbO_3$, lanthanum zirconium oxide such as $La_2Zr_2O_7$, lanthanum tantalum oxide such as $LaTaO_4$, and lanthanum niobium oxide such as $LaNbO_4$ are exemplified.

Then, the weighed compounds are mixed. A mixing method is not particularly limited so long as the compounds can be uniformly mixed by the method. For example, the compounds may be mixed by a mixing machine such as a mixer, in a wet or dry manner. A crucible with a lid is filled with the obtained mixture. Then, the mixture is pre-sintered at a temperature of 600° C. to 900° C., and preferably 850° C., and thereby powder as the raw material is obtained. It is more preferable that the raw material obtained by pre-sintering once is repetitively ground, mixed, and is sintered again.

A grain size is reduced by grinding the obtained raw material powder, in order to easily perform molding. A grinding method is not particularly limited so long as the size of the powder can be reduced by using the method. For example, grinding may be performed by using a grinding device such as a planetary ball mill, a pot mill, and a bead mill, in a wet or dry manner. A rubber tube is filled with the obtained ground material, and then molding to have a rod shape is performed by performing hydrostatic pressing. The obtained rod-like molded article is sintered at a temperature of about 700° C. to 1300° C., and preferably 800° C. to 1150° C., for about 4 hours, and thereby a rod-like raw material is obtained. At this time, the chemical composition of the raw material is $Li_{(7-x-y)z}La_3Zr_{2-x-y}Ta_xNb_yO_{12}$ ($0 \leq x \leq 0.8$, $0.2 \leq y \leq 1$, $0.2 \leq x+y \leq 1$, and $1 < z \leq 2$). In this manner, the rod-like raw material can be produced.

The rod-like raw material is melted in an infrared condensing heating furnace while being rotated at a rotation speed of 30 rpm or higher. Then, the rod-like raw material is quickly cooled at a movement rate of 8 mm/h to 19 mm/h. Thus, $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) which has relative density of 99% or greater, belongs to the cubic system, and has a garnet-related structure is produced. With this producing method, $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal having a length of 2 cm or longer is obtained. Therefore, it is possible to produce a thin piece having the same quality by cutting the crystal.

In a case where $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal having high density is produced by a CZ method, the procedures are as follows. Firstly, a raw material is put into a crucible. Heating is performed, and thus the raw material is melted. A seed crystal is put in the melt of the raw material, and then is pulled up while rotating. It is considered that volatilization of lithium is suppressed and $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal having high density is obtained by setting the movement rate of the melted portion, that is, the pulling-up speed of the seed crystal to be fast, that is, equal to or faster than 8 mm/h.

The $Li_{7-x-y}La_3Zr_{2-x-y}Ta_xNb_yO_{12}$ ($0 \leq x \leq 0.8$, $0.2 \leq y \leq 1$, and $0.2 \leq x+y \leq 1$) crystal having high density in the embodiment can be used as a solid electrolyte of an all solid lithium ion secondary battery, a lithium air battery, or a lithium sulfur battery, because of having excellent lithium ion conductivity. That is, an all solid lithium ion secondary battery according to the embodiment of the present invention includes a positive electrode, a negative electrode, and a solid electrolyte. The solid electrolyte includes the solid electrolyte material in the embodiment.

In a case where the solid electrolyte material in the embodiment is used in a lithium air battery, the solid electrolyte material in the embodiment has a function as a separator configured to prevent direct contact between lithium metal used in a negative electrode and an air on a positive electrode side. Thus, the solid electrolyte material having high density is useful for the solid electrolyte even in order to prevent leakage of an air from the air battery. In a lithium sulfur battery, sulfur used in a positive electrode is easily dissolved in an electrolyte at a time of discharging. Thus, a solid electrolyte material having high ion conductivity is required similar to the all solid lithium ion secondary battery. The present invention will be more specifically described below by using examples. However, the present invention is not limited to the following examples.

EXAMPLES

Example 1: Production of $Li_{6.5}La_3Zr_{1.5}Ta_{0.25}Nb_{0.25}O_{12}$ Crystal by FZ Method, and Evaluation (1) Mixing of Raw Material Firstly, 8.1867 g of lithium carbonate $Li_2CO_3$ (produced by RARE METALLIC Co., Ltd., purity of 99.99%), 11.8982 g of lanthanum oxide $La_2O_3$ (produced by RARE METALLIC Co., Ltd., purity of 99.99%), 4.5007 g of zirconium oxide $ZrO_2$ (produced by RARE METALLIC Co., Ltd., purity of 99.99%), 2.0179 g of tantalum oxide $Ta_2O_5$ (produced by RARE METALLIC Co., Ltd., purity of 99.99%), and 0.4054 g of niobium oxide $Nb_2O_5$ (produced by RARE METALLIC Co., Ltd., purity of 99.99%) were put into an agate mortar, and were uniformly mixed by using a wet method with ethanol.

The lanthanum oxide which had been pre-sintered at 900° C. in advance was used. If comparing the molar ratio Li:La:Zr:Ta:Nb of metal of the mixture to the stoichiometric ratio of $Li_{6.5}La_3Zr_{1.5}Ta_{0.25}Nb_{0.25}O_{12}$ as the aimed material, lithium is more included by 40 mol %. That is, regarding the amount ratio of the mixture of the raw materials, the chemical composition corresponds to $Li_{9.1}La_3Zr_{1.5}Ta_{0.25}Nb_{0.25}O_{12}$.

30.030 g of the mixture were filled with an alumina crucible with a lid (manufactured by NIKKATO CORPORATION, C3 type). The crucible was put into a box type electric furnace (manufactured by Yamato Scientific Co., Ltd., FP100 type). Then, pre-sintering was performed at 850° C. for 6 hours, and thereby powder was obtained. The obtained powder was ground. That is, a zirconia grinding vessel having capacity of 45 mL was filled with 36 g of the powder, 50 g of zirconia balls having a diameter of 5 mm, and 14 mL of ion exchange water. Then, grinding was performed in a manner that the vessel was rotated at the revolution speed of 200 rpm by using a planetary ball mill (manufactured by Fritsch GmbH, model type P-6) for 300 minutes in total. The powder after grinding was dried at 100° C. for 24 hours, and then was classified by using a 250 μm mesh sieve.

(2) Production of Rod-Like Raw Material

A rod-like raw material was produced in procedures as follows, by using powder sieved in the above step. Firstly, a rubber mold was filled with 20.122 g of the powder, and then degassing was performed. The mold in a state of being sealed was put into water, and then was held at 40 MPa for 5 minutes. After pressure of the water is reduced, a molded article was extracted from the mold. The molded article had a cylindrical shape having a diameter of 1.0 cm and a height of 7.3 cm. The cylindrical molded article was sintered at 1150° C. by using a box type electric furnace (manufactured by DENKEN. Co. ltd., model number of KDF009). The molded article which had been taken out had a cylindrical shape having a diameter of 0.92 cm and a height of 6.7 cm.

(3) Growth of $Li_{6.5}La_3Zr_{1.5}Ta_{0.25}Nb_{0.25}O_{12}$ Crystal

Firstly, the rod-like raw material obtained in the above step was installed in a four-oval type infrared condensing heating furnace (FZ furnace) (manufactured by Crystal System Corporation, type of FZ-T-10000H) provided with a 1 kW halogen lamp. The rod-like raw material was in an atmosphere of dry air. The rod-like raw material was heated at an output of 27.9% while being rotated at 30 rpm in a plane perpendicular to a longitudinal direction of the rod-like raw material. After a while, a portion of the polycrystal sample was melted, and thereby a melted portion was formed.

An installation stand of the rod-like raw material was lowered at a movement rate of 14 mm/h, and $Li_{6.5}La_3Zr_{1.5}Ta_{0.25}Nb_{0.25}O_{12}$ crystal (may be referred to as "Sample 1" below) having high density was grown. The chemical composition of Sample 1 was analyzed by X-ray crystal structure analysis. FIG. 1 illustrates the outer shape of Sample 1. As illustrated in FIG. 1, $Li_{6.5}La_3Zr_{1.5}Ta_{0.25}Nb_{0.25}O_{12}$ crystal which had high density and had a length of 6 cm was capable of being produced.

(4) Evaluation of $Li_{6.5}La_3Zr_{1.5}Ta_{0.25}Nb_{0.25}O_{12}$ Crystal

The structure of Sample 1 was investigated by using a single crystal X-ray diffraction apparatus (manufactured by Rigaku Corporation, R-AXIS RAPID-II, AFC-7S) in which a two-dimensional IP detector and a detector with a scintillation counter were provided. FIG. 2 illustrates an X-ray diffraction pattern of Sample 1. As illustrated in FIG. 2, clear diffraction points could be measured. Pieces of diffraction intensity data of Sample 1 were collected, and the crystal structure was investigated by crystal structure analysis program Jana2006. As a result, it was understood that Sample 1 belonged to cubic crystal. Two thin pieces having a thickness of about 0.1 mm were produced by cutting Sample 1 with a diamond cutter, and relative density of the thin pieces was calculated by the above-described method. As a result, the relative density of the thin pieces was respectively 99.8% and 100%.

FIG. 3 illustrates line scan of 00L (0<L<8.5) of Sample 1 measured by using a single crystal X-ray diffraction apparatus. FIG. 4 illustrates line scan of 0KL (K=L, 0<K, and L<8.5). In $Li_{7-x-y}La_3Zr_{2-x-y}Ta_xNb_yO_{12}$ (xy≠0) which has been reported until now, a space group indicating symmetry of the crystal structure is Ia-3d in HM notation. Regarding the space group Ia-3d, based on extinction measurements, a diffraction line is observed only when L is a multiple of 4, in a case of 00L, and a diffraction line is observed only when K and L are even numbers, in a case of 0KL.

However, in FIG. 3, diffraction lines were observed at the forbidden reflection index indicated by L=2+4n (n is an integer) when 00L is 002 and 006. In FIG. 4, diffraction lines were observed at the forbidden reflection index indicated by K=L and K and L of odd numbers, when 0KL is 011, 033, 055, and 077. Originally, the diffraction lines are not observed. Thus, it is implied that the space group of Sample 1 has symmetry lower than Ia-3d. However, since diffraction intensity was very weak, it was not possible to be reflected in crystal structure analysis of Sample 1. The crystal structure analysis was performed for Ia-3d.

Figure 5:
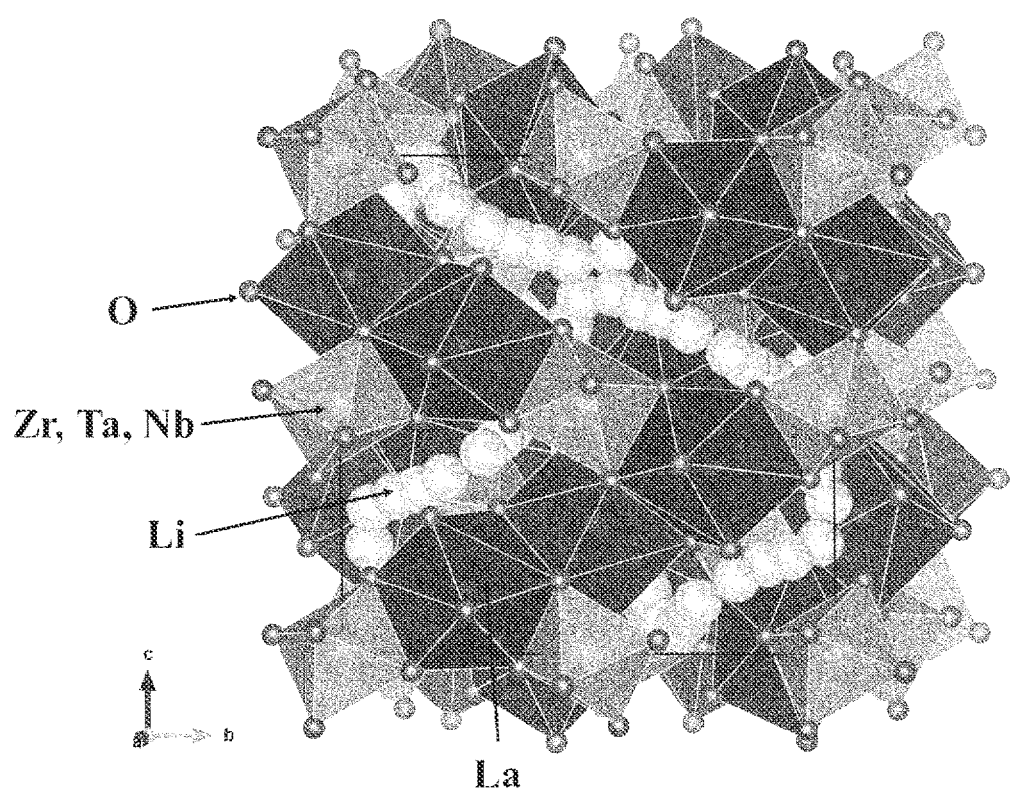
FIG. 5 is a schematic diagram illustrating a garnet-related structure of the $Li_{6.5}La_3Zr_{1.5}Ta_{0.25}Nb_{0.25}O_{12}$ single crystal obtained in Example 1.

FIG. 5 schematically illustrates the crystal structure of Sample 1. Various cubic garnet-related structures which have been reported until now have two kinds of lithium ion sites (24d site and 96h site) in the crystal structure. However, Sample 1 had two lithium ion sites of one kind (two 96h sites) in the crystal structure. That is, in Sample 1, lithium was provided at only one kind of ion site, that is, 96h site. As specific coordinates, Li(x, y, z) was (0.601, 0.189, 0.072) and (0.771, 0.113, 0.025). An R factor indicating reliability of the crystal structure analysis is 2.10%, and thus the crystal structure analysis result is reasonable.

Regarding arrangement of lithium ions occupying only 96h sites, a distance between lithium ions is shorter than that in the cubic garnet-related structure which has been reported until now. Therefore, it is considered that the lithium ion conductivity of Sample 1 is higher than those of other cubic garnet-related structure compounds. A thin piece having a diameter of about 0.7 cm and a thickness of about 0.09 cm was produced by cutting Sample 1 out. An electrode was formed on the front side and the back side of the thin piece by sputtering gold which was a precise circle having a diameter of 0.20 cm and a thickness of 40 nm. If lithium ion conductivity of the sample was measured at 25° C. by an AC impedance method (measurement device: Solarton, 1260) in an atmosphere of nitrogen, Nyquist plot as in FIG. 6 was obtained, and the lithium ion conductivity was $1.1 \times 10^{-3}$ S/cm.

Figure 7:
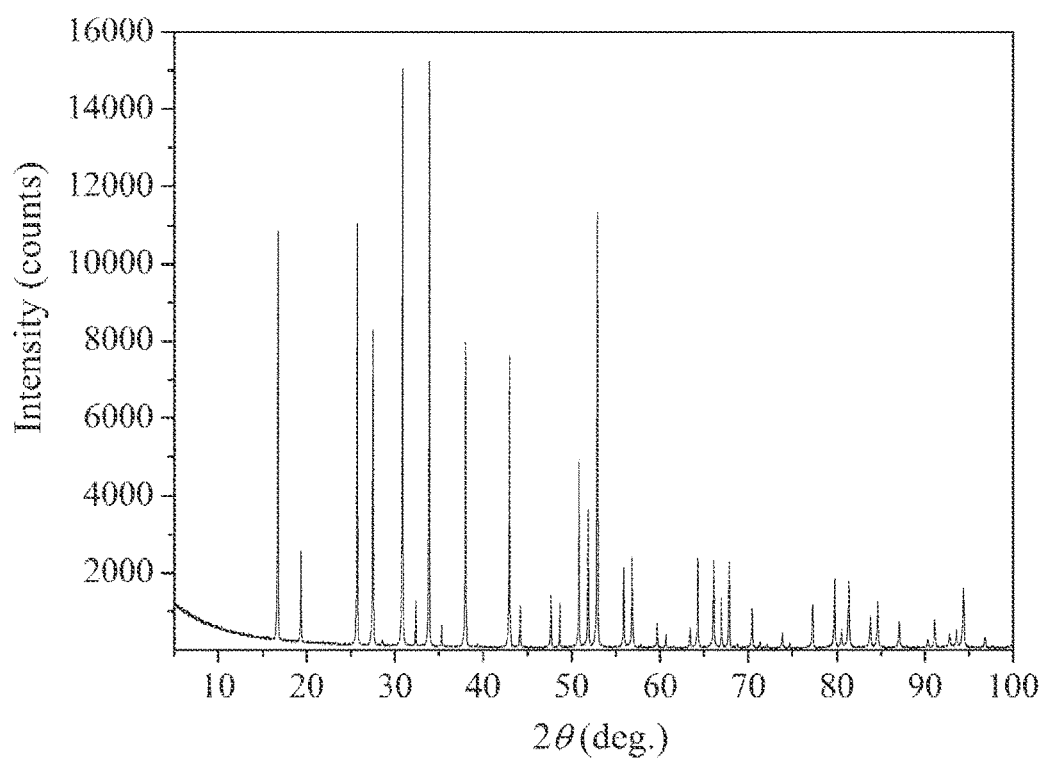
FIG. 7 illustrates a powder X-ray diffraction pattern of the $Li_{6.5}La_3Zr_{1.5}Ta_{0.25}Nb_{0.25}O_{12}$ single crystal obtained in Example 1.

If the lattice constant a was obtained by the least square method and by using reflection of Sample 1 observed in single crystal X-ray diffraction measurement, the lattice constant a was 1.29670 nm±0.00003 nm. It was understood that Sample 1 was a lithium composite oxide having a garnet-related structure, based on the lattice constant. FIG. 7 illustrates results obtained by grinding Sample 1 and performing powder X-ray diffraction measurement. The powder X-ray diffraction pattern of Sample 1 was similar to the pattern of $Li_{7-x-y}La_3Zr_{2-x-y}Ta_xNb_yO_{12}$ ($0.2 \leq x+y \leq 1$) having a cubic garnet-related structure which had been reported until now. The lattice constant a calculated based on results of powder X-ray structure analysis was 1.295076 nm±0.000005 nm. If the results of the single crystal X-ray diffraction measurement and the powder X-ray structure analysis are combined, the lattice constant a of Sample 1 satisfies $1.29507 \text{ nm} \leq a \leq 1.29670 \text{ nm}$.

Example 2: Production of $Li_{6.55}La_3Zr_{1.55}Nb_{0.45}O_{12}$ Crystal by FZ Method, and Evaluation (1) Mixing of Raw Material A mixture of raw materials was obtained from 9.7122 g of lithium carbonate $Li_2CO_3$, 16.4710 g of lanthanum oxide $La_2O_3$, 6.2293 g of zirconium oxide $ZrO_2$, and 3.7234 g of niobium oxide $Nb_2O_5$, in a manner similar to that in Example 1. If comparing the molar ratio Li:La:Zr:Nb of metal of the mixture to the stoichiometric ratio of $Li_{6.55}La_3Zr_{1.55}Nb_{0.45}O_{12}$ as the aimed material, lithium is more included by 40 mol %. That is, regarding the amount ratio of the mixture of the raw materials, the chemical composition corresponds to $Li_{9.17}La_3Zr_{1.55}Nb_{0.45}O_{12}$. 30.138 g of the mixture were filled with an alumina crucible with a lid. Then, pre-sintering, grinding, and classifying were performed in similar manners to those in Example 1.

(2) Production of Rod-Like Raw Material

A rod-like raw material was produced in procedures as follows, in a manner similar to that in Example 1. That is, a rubber mold was filled with 20.287 g of sieved powder. Molding was performed, and thereby a cylindrical molded article having a diameter of 1.0 cm and a height of 9.8 cm was obtained. Then, the molded article was sintered, and thereby a cylindrical molded article having a diameter of 0.96 cm and a height of 9.2 cm was obtained.

Figure 8:
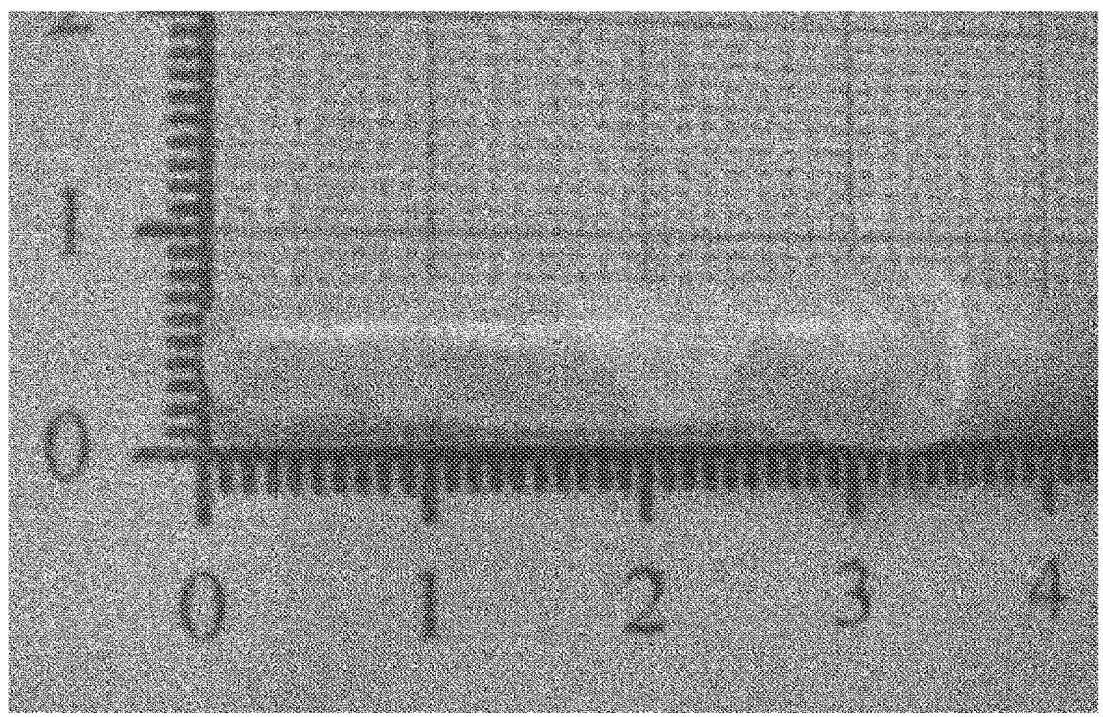
FIG. 8 is an exterior photograph of $Li_{6.55}La_3Zr_{1.55}Nb_{0.45}O_{12}$ single crystal obtained in Example 2.

(3) Growth of $Li_{6.55}La_3Zr_{1.55}Nb_{0.45}O_{12}$ Crystal $Li_{6.55}La_3Zr_{1.55}Nb_{0.45}O_{12}$ crystal (may be referred to as "Sample 2" below) having high density was grown in a manner similar to that in Example 1, except that the rotation speed was set to 40 rpm, the output was set to 30.3%, and the descent speed of the installation stand was set to 19 mm/h. The chemical composition of Sample 2 was analyzed by X-ray crystal structure analysis. FIG. 8 illustrates the outer shape of Sample 2. As illustrated in FIG. 8, $Li_{6.55}La_3Zr_{1.55}Nb_{0.45}O_{12}$ crystal having high density and a length of 6 cm was capable of being produced.

(4) Evaluation of $Li_{6.55}La_3Zr_{1.55}Nb_{0.45}O_{12}$ Crystal

Figure 9:
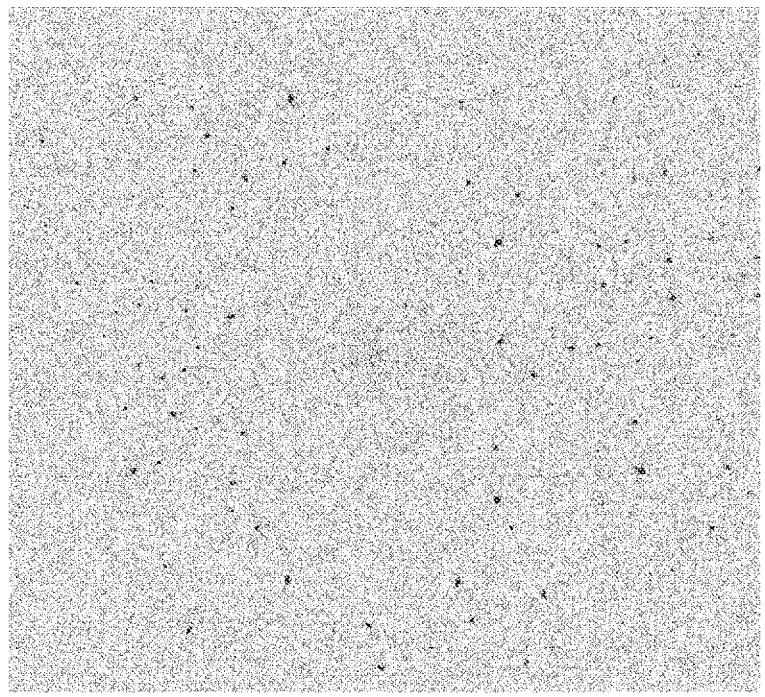
FIG. 9 illustrates a single crystal X-ray diffraction pattern of the $Li_{6.55}La_3Zr_{1.55}Nb_{0.45}O_{12}$ single crystal obtained in Example 2.

The structure of Sample 2 was investigated by using a single crystal X-ray diffraction apparatus, in a manner similar to that in Example 1. FIG. 9 illustrates an X-ray diffraction pattern of Sample 2. As illustrated in FIG. 9, clear diffraction points could be measured. If the crystal structure was investigated by a crystal structure analysis program in a manner similar to that in Example 1, it was understood that Sample 2 belonged to the cubic crystal. Four thin pieces having a thickness of 0.1 mm were produced by cutting Sample 2 with a diamond cutter, and relative density of the thin pieces was calculated. As a result, the relative density was respectively 99.2%, 99.7%, 99.9%, and 100%.

FIG. 10 illustrates line scan of 00L (0<L<8.5) of Sample 2 measured by using a single crystal X-ray diffraction apparatus. FIG. 11 illustrates line scan of 0KL (K=L, 0<K, and L<8.5). In $Li_{7-y}La_3Zr_{2-y}Nb_yO_{12}$ (y≠0) which has been reported until now, a space group indicating symmetry of the crystal structure is Ia-3d in HM notation. Regarding the space group Ia-3d, based on extinction measurements, a diffraction line is observed only when L is a multiple of 4, in a case of 00L, and a diffraction line is observed only when K and L are even numbers, in a case of 0KL.

However, in FIG. 10, diffraction lines were observed at the forbidden reflection index indicated by L=2+4n (n is an integer) when 00L is 002 and 006. In FIG. 11, diffraction lines were observed at the forbidden reflection index indicated by K=L and K and L of odd numbers, when 0KL is 011, 033, 055, and 077. Originally, the diffraction lines are not observed. Thus, it is implied that the space group of Sample 2 has symmetry lower than Ia-3d. However, since diffraction intensity was very weak, it was not possible to be reflected in crystal structure analysis. Therefore, the crystal structure analysis was performed for Ia-3d.

Figure 12:
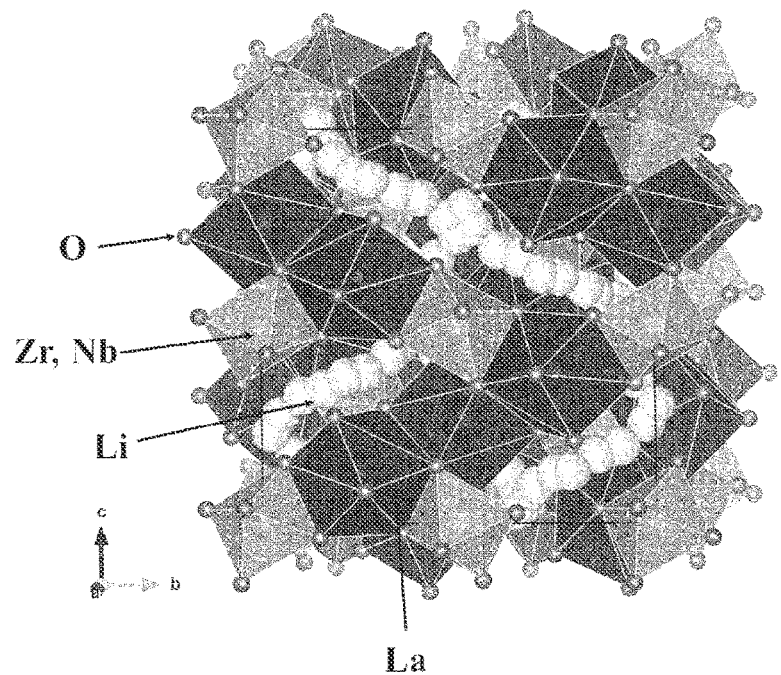
FIG. 12 is a schematic diagram illustrating a garnet-related structure of the $Li_{6.55}La_3Zr_{1.55}Nb_{0.45}O_{12}$ single crystal obtained in Example 2.

FIG. 12 schematically illustrates the crystal structure of Sample 2. Various cubic garnet-related structures which have been reported until now have two kinds of lithium ion sites (24d site and 96h site) in the crystal structure. However, Sample 2 had two lithium ion sites of one kind (two 96h sites) in the crystal structure. That is, in Sample 2, lithium was provided at only one kind of ion site, that is, 96h site. As specific coordinates, Li(x, y, z) was (0.726, 0.130, 0.017) and (0.602, 0.194, 0.072). The R factor indicating reliability of the crystal structure analysis is 3.05%, and thus the crystal structure analysis result is reasonable.

Regarding arrangement of lithium ions occupying only 96h sites, a distance between lithium ions is shorter than that in the cubic garnet-related structure which has been reported until now. Therefore, it is considered that the lithium ion conductivity of Sample 2 is higher than those of other cubic garnet-related structure compounds. A thin piece having a diameter of about 0.8 cm and a thickness of about 0.10 cm was produced by cutting Sample 2 out. Then, the Nyquist plot illustrated in FIG. 13 was obtained in a manner similar to that in Example 1. The lithium ion conductivity was $1.4 \times 10^{-3}$ S/cm.

Figure 14:
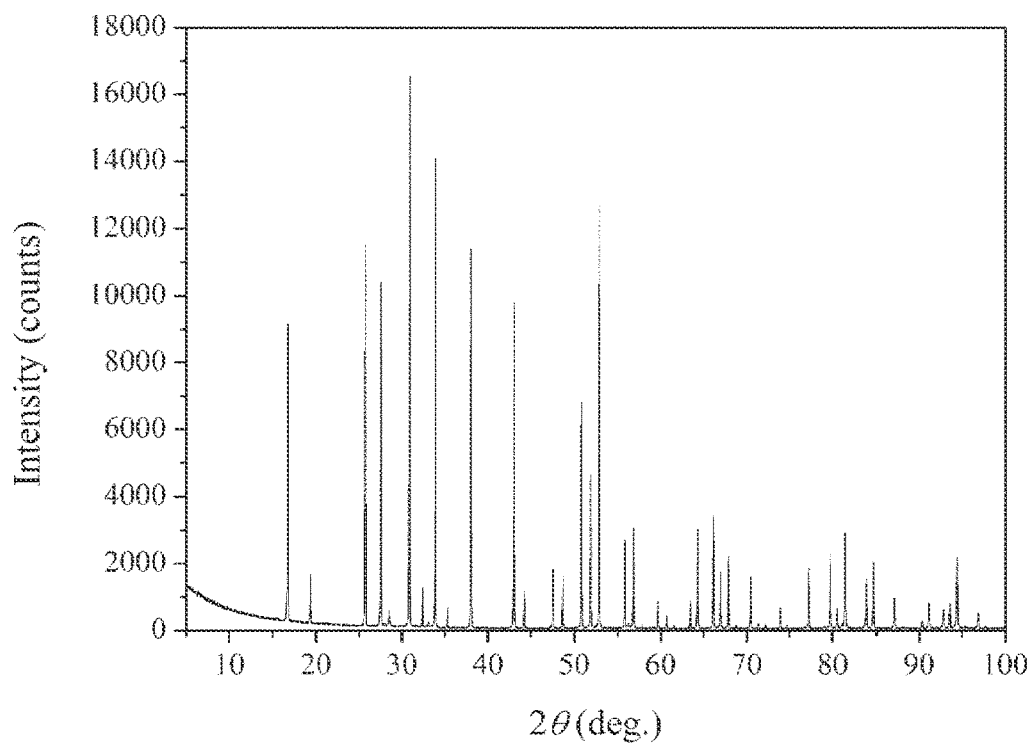
FIG. 14 illustrates a powder X-ray diffraction pattern of the $Li_{6.55}La_3Zr_{1.55}Nb_{0.45}O_{12}$ single crystal obtained in Example 2.

If the lattice constant a was obtained by the least square method and by using reflection of Sample 2 observed in single crystal X-ray diffraction measurement, the lattice constant a was 1.2942 nm±0.0009 nm. It was understood that Sample 2 was a lithium composite oxide having a garnet-related structure, based on the lattice constant. FIG. 14 illustrates results obtained by grinding Sample 2 and performing powder X-ray diffraction measurement. The powder X-ray diffraction pattern of Sample 2 was similar to the pattern of $Li_{7-x}La_3Zr_{2-x}Nb_xO_{12}$ (0.2≤x≤1) having a cubic garnet-related structure which had been reported until now. The lattice constant a calculated based on results of powder X-ray structure analysis was 1.29481 nm±0.00005 nm. If the results of the single crystal X-ray diffraction measurement and the powder X-ray structure analysis are combined, the lattice constant a of Sample 2 satisfies 1.2942 nm≤a≤1.2949 nm.

Example 3: Production of all Solid Lithium Ion Secondary Battery 0.0105 mol of lithium acetate dihydrate (produced by Sigma-Aldrich Co. LLC) and 0.01 mol of cobalt acetate tetrahydrate (produced by Wako Pure Chemical Industries, Ltd) were dissolved in 100 g of ethylene glycol (produced by Wako Pure Chemical Industries, Ltd). 10 g of polyvinylpyrrolidone K-30 (produced by Wako Pure Chemical Industries, Ltd) were added and dissolved, and thereby a lithium cobaltate precursor solution of 0.1 mol/kg was prepared. The amount of lithium acetate is set to be greater than the amount of cobalt acetate by 5 mol % in consideration of the amount of evaporated lithium in sintering. Thin pieces having a diameter of about 0.8 cm and a thickness of about 0.10 cm were produced by cutting Sample 1 and Sample 2 out respectively.

Figure 15:
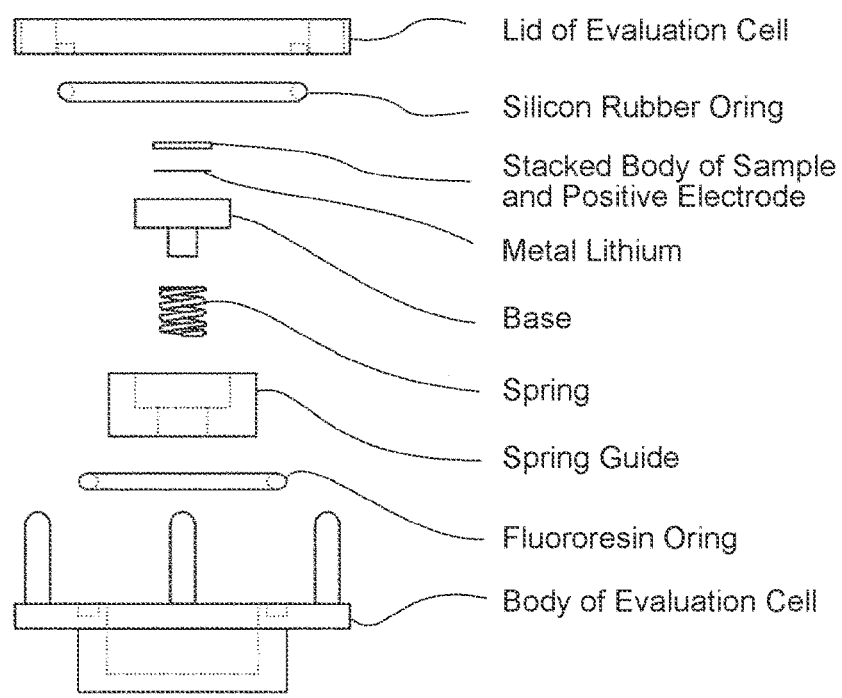
FIG. 15 is a schematic diagram illustrating an all solid lithium ion secondary battery manufactured in Example 3.

10 μL of the lithium cobaltate precursor solution were dropped on the thin pieces, and then pre-sintering was performed at 400° C. for 20 minutes. Sintering was performed at 850° C. for 10 minutes. Thus, a lithium cobaltate layer as a positive electrode was formed on the surface of each of the samples, and thereby a stacked body of the sample and the lithium cobaltate layer as the positive electrode was obtained. As illustrated in FIG. 15, the stacked body of the sample and the positive electrode, and metal lithium punched to have a diameter of 4 mm were put into a commercial HS cell for battery evaluation (manufactured by Hohsen Corp.) in a glove box. Thereby, an all solid lithium ion secondary battery was manufactured. It was confirmed that the all solid lithium ion secondary battery had a function as a battery because an open circuit voltage was 3.0 V when Sample 1 was used, and was 2.8 V when Sample 2 was used.

INDUSTRIAL APPLICABILITY

According to the present invention, the solid electrolyte material including $Li_{7-x-y}La_3Zr_{2-x-y}Ta_xNb_yO_{12}$ (0≤x≤0.8, 0.2≤y≤1, and 0.2≤x+y≤1) crystal having high density can be utilized as a solid electrolyte material, a separator, and the like of an all solid lithium ion secondary battery, a lithium air battery, and a lithium sulfur battery.

What is claimed is:

1. A lithium-containing garnet crystal body which has a chemical composition represented by $Li_{7-x-y}La_3Zr_{2-x-y}Ta_xNb_yO_{12}$ wherein 0≤x≤0.8, 0.2≤y≤1, and 0.2≤x+y≤1, a relative density of 99% or greater, belongs to a cubic system, and has a garnet-related structure,
    wherein lithium ion conductivity of the lithium-containing garnet crystal body is equal to or greater than $1.0 \times 10^{-3}$ S/cm.

2. The lithium-containing garnet crystal body according to claim 1,
    wherein x=0.

3. The lithium-containing garnet crystal body according to claim 1,
    wherein a lattice constant a satisfies 1.28 nm≤a≤1.30 nm.

4. The lithium-containing garnet crystal body according to claim 1,
    wherein a lithium ion occupies two or more 96h sites in a crystal structure.

5. The lithium-containing garnet crystal body according to claim 1,
    wherein, in single crystal X-ray diffraction measurement, diffraction intensity is given to a forbidden reflection index of a space group Ia-3d of a plane index 00L (L=2+4n, n is an integer) and/or a plane index 0KL (K=L, K and L are odd numbers).

6. The lithium-containing garnet crystal body according to claim 1,
    wherein the relative density is 100%.

7. A producing method of a lithium-containing garnet crystal body which has a chemical composition represented by $Li_{7-x-y}La_3Zr_{2-x-y}Ta_xNb_yO_{12}$ wherein 0≤x≤0.8, 0.2≤y≤1, and 0.2≤x+y≤1, a relative density of 99% or greater, belongs to a cubic system, and has a garnet-related structure,
    wherein lithium ion conductivity of the lithium-containing garnet crystal body is equal to or greater than $1.0 \times 10^{-3}$ S/cm, the method comprising:
    forming a melted portion at which single crystal is grown, by melting at least a portion of a raw material having a chemical composition represented by $Li_{(7-x-y)z}La_3Zr_{2-x-y}Ta_xNb_yO_{12}$ (0≤x≤0.8, 0.2≤y≤1, 0.2≤x+y≤1, and 1<z≤2); and
    moving the melted portion at a movement rate of 8 mm/h or faster to grow single crystal.

8. The producing method of a lithium-containing garnet crystal body according to claim 7,
    wherein x=0.

9. The producing method of a lithium-containing garnet crystal body according to claim 7,
    wherein the movement rate is 8 mm/h to 19 mm/h.

10. The producing method of a lithium-containing garnet crystal body according to claim 7, further comprising:
    rotating the melted portion around a central axis parallel to a movement direction of the melted portion, at a rotation speed of 30 rpm or higher.

11. The producing method of a lithium-containing garnet crystal body according to claim 10,
    wherein the rotation speed is 30 rpm to 60 rpm.

12. An all solid lithium ion secondary battery comprising:
    a positive electrode;
    a negative electrode; and
    a solid electrolyte,
    wherein the solid electrolyte includes the lithium-containing garnet crystal body according to claim 1.

* * * * *